United States Patent [19]

Gyorgy et al.

[11] 4,171,389

[45] Oct. 16, 1979

[54] PROCESS FOR SUPPRESSING HARD BUBBLES IN MAGNETIC BUBBLE DEVICES

[75] Inventors: Ernst M. Gyorgy, Madison; Roy C. LeCraw, Summit; Raymond Wolfe, New Providence, all of N.J.

[73] Assignee: Bell Telephone Laboratories, Incorporated, Murray Hill, N.J.

[21] Appl. No.: 702,392

[22] Filed: Jul. 6, 1976

Related U.S. Application Data

[63] Continuation of Ser. No. 558,142, Mar. 13, 1975, abandoned.

[51] Int. Cl.² .............................................. H01F 10/02
[52] U.S. Cl. ..................................... 427/130; 427/128
[58] Field of Search ............................... 427/127–132, 427/47–48

[56] References Cited

U.S. PATENT DOCUMENTS 3,759,745  9/1973  Dixon et al. ................... 427/130

Primary Examiner—Bernard D. Pianalto
Attorney, Agent, or Firm—Peter A. Businger

[57] ABSTRACT

A method is disclosed for suppressing hard bubbles in epitaxial magnetic garnet films. The method comprises annealing in an essentially inert atmosphere and renders the annealed film incapable of sustaining hard bubbles.

7 Claims, 1 Drawing Figure

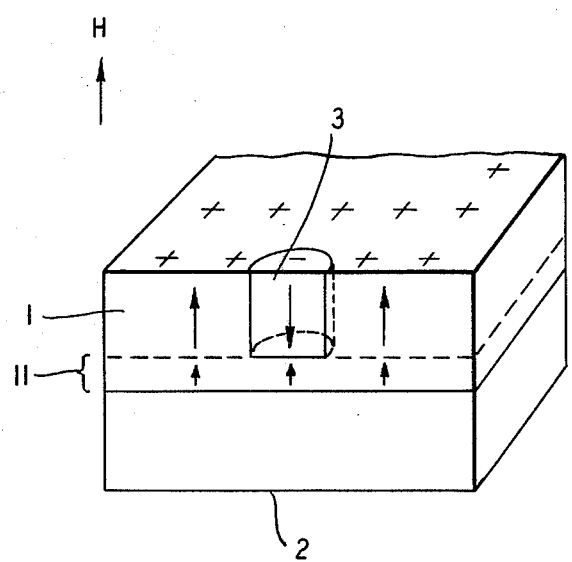

PROCESS FOR SUPPRESSING HARD BUBBLES IN MAGNETIC BUBBLE DEVICES

This application is a continuation of application Ser. No. 558,142 filed Mar. 13, 1975 and now abandoned.

BACKGROUND OF THE INVENTION

1. Field of the Invention

This invention is concerned with a magnetic bubble device comprising a magnetic garnet film in which magnetic bubbles can propagate.

2. Description of the Prior Art

Magnetic bubble devices typically consist of a flat, nonmagnetic garnet substrate such as gadolinium gallium garnet, $Gd_3Ga_5O_{12}$ or neodymium gallium garnet, $Nd_3Ga_5O_{12}$, and a thin epitaxial layer of a magnetic garnet deposited on the substrate. Magnetic layers are typically of a thickness on the order of 10 micrometers and have their easy axis of magnetization perpendicular to the substrate. Deposition techniques such as liquid phase epitaxy and chemical vapor deposition are being used successfully for the creation of such layers.

Interest in magnetic bubble devices is due in large part to their potential application in communications and data processing equipment. Basic to such applications is the ability of the magnetic film, when magnetically biased in a direction perpendicular to the film, to sustain small domains magnetized in a direction opposite to the direction of the bias field. These domains are of cylindrical shape and extend from the surface of the magnetic film to the vicinity of the film-substrate interface. They typically are of a diameter approximately equal to the thickness of the film.

Magnetic bubbles can be created, propagated, and annihilated by appropriate local modulation of the intensity of the bias field. They retain their identity within a range of bias field strengths but disappear once the strength of the so-called collapse field is reached.

It has become apparent that special care is required to assure uniformity of magnetic bubbles. Specifically, it is essential to suppress undesirable bubbles designated as hard bubbles which are of lower mobility than normal bubbles and which move at an angle to, rather than in the direction of the magnetic field gradient. Hard bubbles are also characterized in that their collapse field strength is considerably higher than that of normal bubbles.

The problem of hard bubble suppression has received a considerable amount of attention. Among proposals for its alleviation are the multilayer deposition method described in "Multilayer Epitaxial Garnet Films for Magnetic Bubble Devices—Hard Bubble Suppression" by A. H. Bobeck, S. L. Blank, and H. J. Levinstein, published in *The Bell System Technical Journal*, July–August 1972, pages 1431-1435. This method consists of interposing a low-moment second magnetic layer between the substrate and the bubble sustaining layer. It was found that in the presence of this layer only normal bubbles can be sustained.

An alternate method for suppressing hard bubbles is that described in "Suppression of Hard Bubbles in Magnetic Garnet Films by Ion Implantation" by R. Wolfe and J. C. North, published in *The Bell System Technical Journal*, July–August 1972, pages 1436-1439, which consists of implanting hydrogen or helium ions into the free surface of the magnetic film. As a result of this implantation the easy axis of magnetization in a thin surface layer becomes parallel to the surface.

Further methods for dealing with hard bubbles have been described in "Suppression of Hard Bubbles by a Thin Permalloy Layer" by Y. S. Lin and G. E. Keefe, *Applied Physics Letters*, Vol. 22, No. 11, June 1, 1973, pages 603-604, "Hard-Bubble-Free Garnet Epitaxial Films: The Garnet-Permalloy Composite Structure" by M. Takahashi, H. Nishida, T. Kobayashi and Y. Sugita, *Journal of the Physical Society of Japan*, 34 (1973) page 1416, and in "New Approaches to Hard Bubble Suppression" by R. D. Henry, P. J. Besser, R. G. Warren and E. C. Whitcomb, presented at the Institute of Electrical and Electronics Engineers Conference on Magnetism and Magnetic Materials, 24–27 Apr., 1973, Washington, D.C.

SUMMARY OF THE INVENTION

The invention is a method for treating magnetic bubbles devices whose substrate contains gallium or aluminum ions. The method consists of annealing the device in an inert atmosphere to create a layer of lowered magnetic moment adjacent to the substrate.

BRIEF DESCRIPTION OF THE DRAWING

The drawing shows a magnetic bubble device in which hard bubbles have been suppressed by the method of annealing in an inert atmosphere.

DETAILED DESCRIPTION

The FIGURE shows a magnetic garnet film 1 which is deposited on a nonmagnetic substrate 2. Film 1 is magnetized in the direction of the bias field H except for magnetic bubble 3 which is magnetized opposite to the direction of the bias field. As a result of annealing in an inert atmosphere the magnetic moment in layer 11 of film 1 is smaller than that in the bulk of film 1 whereby hard bubbles are suppressed.

The process applies to magnetic bubble devices whose nonmagnetic garnet substrate contains gallium or aluminum ions and whose magnetic film may or may not contain gallium or aluminum ions. The method is aimed at preventing hard bubbles in the film and calls for annealing the device under an inert atmosphere, such as nitrogen, helium, or argon. Due to its low cost, a nitrogen atmosphere is preferred. Annealing temperatures in the vicinity of 1100° C. are preferred and annealing times of at least one hour are recommended. Annealing times in excess of twenty-four hours do not contribute appreciably to suppressing hard bubbles. Annealing temperatures in excess of 1200° C. should be avoided to prevent unwanted magnetic changes such as reduction of the magnetic anisotropy.

As a result of the annealing, a layer of reduced magnetic moment is created in the magnetic film adjacent to the substrate. Most likely, this reduction in magnetic moment is due to a depletion of iron ions in the crystal lattice of the film. Specifically, tetrahedral iron ions in the film are believed to be replaced with tetrahedral gallium or aluminum ions by ion interdiffusion between the film and the substrate. It is evident that, for interdiffusion between magnetic ions in the film and nonmagnetic ions in the substrate to result in a change of magnetic moment in the film, the concentration of nonmagnetic ions in the substrate is required to be different from the concentration of such ions in the film. Specifically, in order for the magnetization of a layer of a film adjacent to the substrate to decrease significantly, a substantially greater concentration of gallium or aluminum ions is required in the substrate as compared to their concentration in the film. The resulting reduction in magnetic moment in a thin layer of film acts analogous to the layer of Bobeck et al reference to suppress hard bubbles.

Useful rates of ion diffusion in epitaxial garnet layers in general require the presence of lattice defects. Such defects may either be oxygen vacancies or the presence of interstitial cations. While it has not been ascertained which type of lattice defects is created by annealing, the temporary creation of oxygen vacancies is considered most likely. Specifically, annealing in an inert atmosphere is likely to cause diffusion of oxygen out of the surface of the magnetic film which causes oxygen vacancies to migrate through the magnetic film to the substrate film interface.

EXAMPLES

Example I

A film of the composition $Y_{1.93}Sm_{0.11}Ca_{0.96}Ge_{0.96}Fe_{4.04}O_{12}$ and of a thickness of 6 micrometers, was annealed in an essentially pure nitrogen atmosphere at 1075° C. for two hours. Before annealing bubbles were observed to have collapse field strengths varying between 78 and 117 Oe. After the anneal all bubbles collapsed at 71 Oe.

Example II

In a film of composition $YGdTmGa_{0.7}Fe_{4.3}O_{12}$ and a thickness of 6 micrometers, hard bubble suppression was obtained after annealing under nitrogen at 1100° C. for eighteen hours.

What is claimed is:

1. A method for suppressing hard bubbles in a magnetic bubble device comprising an epitaxial magnetic garnet film deposited on a nonmagnetic garnet substrate, said substrate containing ions selected from the group consisting of aluminum ions and gallium ions and said ions having a concentration in the substrate substantially greater than in the film CHARACTERIZED IN THAT said magnetic bubble device is annealed at a temperature in the range of from 1000° C. to 1200° C. and with at least a portion of said film exposed to an inert atmosphere whereby the magnetic moment is significantly altered in a layer of said portion of said film adjacent to said substrate.

2. Method of claim 1 in which said inert atmosphere consists essentially of nitrogen, 3. Method of claim 1 in which said magnetic film is of composition $YGdTmGa_{0.7}Fe_{4.3}O_{12}$.

4. Method of claim 1 in which said device is annealed for a time in the range of from one to twenty-four hours.

5. Method of claim 1 in which said magnetic garnet film has a thickness in the range of from 1-20 micrometers.

6. Method of claim 1 in which said substrate is a rare earth garnet.

7. Method of claim 1 in which said magnetic film is of composition $Y_{1.93}Sm_{0.11}Ca_{0.96}Ge_{0.96}Fe_{4.04}O_{12}$.

* * * * *

UNITED STATES PATENT AND TRADEMARK OFFICE
CERTIFICATE OF CORRECTION

PATENT NO. : 4,171,389
DATED : October 16, 1979
INVENTOR(S) : Ernst M. Gyorgy, Roy C. LeCraw and Raymond Wolfe It is certified that error appears in the above-identified patent and that said Letters Patent are hereby corrected as shown below:

Column 3, line 22, "$Ge_{0.9}$" should read --$Ge_{0.96}$--; line 23, "6Fe" should read --Fe--. Column 4, line 13, after "film", --in which the magnetic moment is significantly altered-- should be inserted.

Signed and Sealed this

Twenty-sixth Day of February 1980

[SEAL]

Attest:

SIDNEY A. DIAMOND

Attesting Officer

Commissioner of Patents and Trademarks